US007782044B2

(12) United States Patent
Hannewald

(10) Patent No.: US 7,782,044 B2

(45) Date of Patent: Aug. 24, 2010

(54) COVER

(75) Inventor: Thomas Hannewald, Griesheim (DE)

(73) Assignee: Siemens Aktiengesellschaft, Munich (DE)

( * ) Notice: Subject to any disclaimer, the term of this patent is extended or adjusted under 35 U.S.C. 154(b) by 1547 days.

(21) Appl. No.: 11/062,931

(22) Filed: Feb. 23, 2005

(65) Prior Publication Data

US 2005/0155780 A1 Jul. 21, 2005

Related U.S. Application Data

(63) Continuation of application No. PCT/DE03/03006, filed on Oct. 9, 2003.

(30) Foreign Application Priority Data

Oct. 2, 2002 (DE) ............................ 102 46 113.9

(51) Int. Cl.
*G01R 1/04* (2006.01)

(52) U.S. Cl. ...................................................... 324/156

(58) Field of Classification Search ................. 324/156, 324/207.2

See application file for complete search history.

(56) References Cited

U.S. PATENT DOCUMENTS 6,147,315 A * 11/2000 Rudolph et al. .......... 200/61.54
6,407,543 B1 6/2002 Hagio et al.

FOREIGN PATENT DOCUMENTS

| | | | |
|---|---|---|---|
| DE | 4405439 | A1 | 8/1995 |
| DE | 4443502 | A1 | 6/1996 |
| DE | 4430324 | C1 | 10/1996 |
| DE | 19515622 | C2 | 6/2000 |
| DE | 20002719 | U1 | 6/2000 |
| DE | 10001846 | A1 | 7/2000 |
| DE | 10032306 | A1 | 1/2001 |
| DE | 10023695 | A1 | 6/2001 |
| DE | 20022805 | U1 | 8/2002 |
| EP | 0844378 | A2 | 5/1998 |
| EP | 0989292 | A2 | 3/2000 |
| EP | 01191209 | A1 | 3/2002 |
| WO | WO 02/081885 | A1 | 10/2002 |

OTHER PUBLICATIONS

Derwent Abstract—EP-0989292A2; Mar. 29, 2000; Mannesmann VDO Aktiengesellschaft, D-60388 Frankfurt am Main (Germany).

(Continued)

*Primary Examiner*—Reena Aurora
(74) *Attorney, Agent, or Firm*—Cohen Pontani Lieberman & Pavane LLP

(57) ABSTRACT

The invention relates to a cover for a chamber of a housing of an appliance, said cover comprising an approximately plate-type carrier carrying a network of conductors which is embodied as a pressed screen and provided with a sensor. A plug receiving element for an appliance plug for contacting the network of conductors is provided on the carrier. The pressed screen is supported on the plate-type carrier, held by fixing elements, and covered by a cover connected to the carrier on the peripheral edge thereof.

20 Claims, 2 Drawing Sheets

OTHER PUBLICATIONS

Derwent Abstract—DE-19515622C2; Jun. 8, 2000; Temic Telefunken microelectronic GmbH; D-90411 Nürnberg (Germany).
Derwent Abstract—DE-10023695A1; Jun. 7, 2001; AB Elektronic GmbH, D-59368 Werne (Germany).
Derwent Abstract—DE-10001846A1; The Whitaker Corporiation, US-Wilmington, Del. (USA), Jul. 20, 2000.
Derwent Abstract—DE-4405439A1; Aug. 24, 1995; VDO Adolf Schindling AG, D-60326 Frankfurt (Germany).
Derwent Abstract—DE-20022805U1;Aug. 22, 2002;Sumitomo Wiring Systems, Ltd.,JP-Yokkaichi, Mie (Japan).
Derwent Abstract—DE-20002719U1; Jun. 8, 2000; AB Elektronik GmbH, D-59368 Werne (Germany).
Derwent Abstract—DE-4443502A1; Jun. 13, 1996; Robert Bosch GmbH; D-70469 Stuttgart (Germany).
Derwent Abstract—DE-4430324C1; VDO Adolf Schindling AG, D-60326 Frankfurt (Germany), Oct. 10, 1996.

* cited by examiner

COVER

CROSS REFERENCE TO RELATED APPLICATIONS

The present application is a continuation of international application PCT/DE2003/003006, filed on Sep. 10, 2003, which designated the United States and was pending at the time of designation; and further claims priority to German patent application 10246113.9, filed Oct. 2, 2002; the both of which are herein incorporated by reference.

BACKGROUND OF THE INVENTION

The invention relates to a cover for a chamber of a housing of a device, having an approximately plate-like carrier which bears a conductor track pattern formed as a punched grid, having a sensor arranged on the conductor track pattern and a plug holder formed on the carrier for a device plug for making contact with the conductor track pattern.

In such a cover, it is known to encapsulate the punched grid during the production of the carrier by the plastic injection molding process and subsequently to divide the connecting points of the punched grid not belonging to the conductor track pattern.

On account of the high injection pressures which act on the punched grid in the process, the configuration of the punched grid must be designed with regard to the courses of the conductor tracks, the spacings of the conductor tracks and the connecting points in such a way that no deformation of the conductor tracks and, at the same time, displacement of the sensor position and of the plug contact can occur. These high requirements necessitate a great deal of effort and lead to restrictions on the courses of the conductor tracks.

It is therefore an object of the invention to provide a cover of the type mentioned at the beginning which consists of simple components, can easily be mounted and ensures a satisfactory function.

SUMMARY OF THE INVENTION

According to the invention, this object is achieved in that the punched grid resting on the approximately plate-like carrier is held by fixing elements and is covered by a covering connected to the carrier at its circumferential edge.

By means of this construction, the separately produced punched grid is fitted to the likewise separately produced carrier and held in its installed position by the fixing elements. After that, the connecting points are separated and the covering is fitted.

Since there are no applications of force as a result of high injection pressures, a few connecting points suffice. The fixing elements lead to exact positioning of the conductor tracks and therefore also of the sensor and the plug-in contacts, so that only small spacings are needed between the conductor tracks of the conductor track pattern. Therefore, the overall size of the cover can also be kept small.

The sensor can be fitted without difficulty before the punched grid is mounted. This makes it possible to fabricate the punched grid with the sensor at a different location from the location of the production of carrier and covering, so that fabrication can be carried out more efficiently, more flexibly and more economically.

Variants of the cover having other dimensions and other plugs for different devices are easily possible, it being possible for the basic dimensions for the carrier to be maintained.

The punched grid can have contact tongues for making contact with the device plug, which project into the plug holder.

In this case, the contact tongues can in particular be parts of the punched grid bent down out of the plane of the punched grid, reducing the number of components required.

For the purpose of correct positioning of the device plug in relation to the contact tongues, the plug holder can be formed in the manner of a sleeve protruding from the carrier, the plug holder preferably being formed in one piece with the plug.

In order to make further contacts, the carrier plate can have one or more leadthroughs, through which one or more further contact tongues projecting on the side of the carrier plate facing away from the punched grid are led.

In this case, in order to reduce the components, the one or more further contact tongues are in particular parts of the punched grid bent down out of the plane of the punched grid.

In order to protect the sensor against contamination and mechanical damage, on its side facing away from the punched grid the carrier can have a sensor housing, into which the sensor projects, carrier and sensor housing preferably being formed in one piece.

The further contact tongues and/or the sensor or the sensor housing can project into the chamber of the housing.

For the purpose of protection against environmental influences in a component-saving manner, the cover is welded, in particular laser welded, or adhesively bonded to the carrier at its circumferential edge.

However, it is also possible for the cover to be connected detachably to the carrier, resting with its circumferential edge over a circumferential seal on the carrier and in particular by means of a screw connection.

Simple, rapid and accurately-positioned mounting is made possible by the fact that the fixing elements are latching elements or clamping elements into which the punched grid can be latched or clamped.

In this case, if the latching elements or clamping elements are formed in one piece with the carrier, this leads to a reduction in the mounting effort and to fewer necessary components.

The carrier can be a plastic part, in particular a plastic injection molding, which can be produced simply and at the same time insulates the conductor tracks from one another.

This ability to be produced simply is also provided if the covering is a plastic part shaped like a shell or pot, in particular a plastic injection molding.

The punched grid can be constructed in different ways. For example, the punched grid can be punched out from a metal sheet (lead frame) or from a printed circuit board bearing conductor tracks.

For the purpose of simple mounting, it can be possible for the carrier to be connected to the housing by means of screws, closing the chamber of the housing.

The cover can be used for an extremely wide range of devices. For example, it can be used on gas pedal modules. A preferable use is for the device to be a throttle flap connecting piece for an internal combustion engine, in particular of a motor vehicle, and for a continuous throttle opening which can be shut off by a throttle flap arranged on a throttle flap shaft to be formed in the housing, an electric-motor drive, by means of which the throttle flap shaft can be driven pivotably, in particular via a gearbox being arranged in the housing.

In this case, the sensor can be a position sensor registering the position of the throttle flap shaft or of the gearbox.

Registering the position of the gearbox without contact is in this case possible in a simple manner if the sensor is a magnetoresistive sensor or a Hall sensor.

The at least one or further contact tongues can be a motor plug for making contact with the electric-motor drive.

BRIEF DESCRIPTION OF THE SEVERAL VIEWS OF THE DRAWINGS

Exemplary embodiments of the invention are illustrated in the drawing and will be described in more detail in the following text. In the drawing.

DETAILED DESCRIPTION OF THE INVENTION

Figure 1:
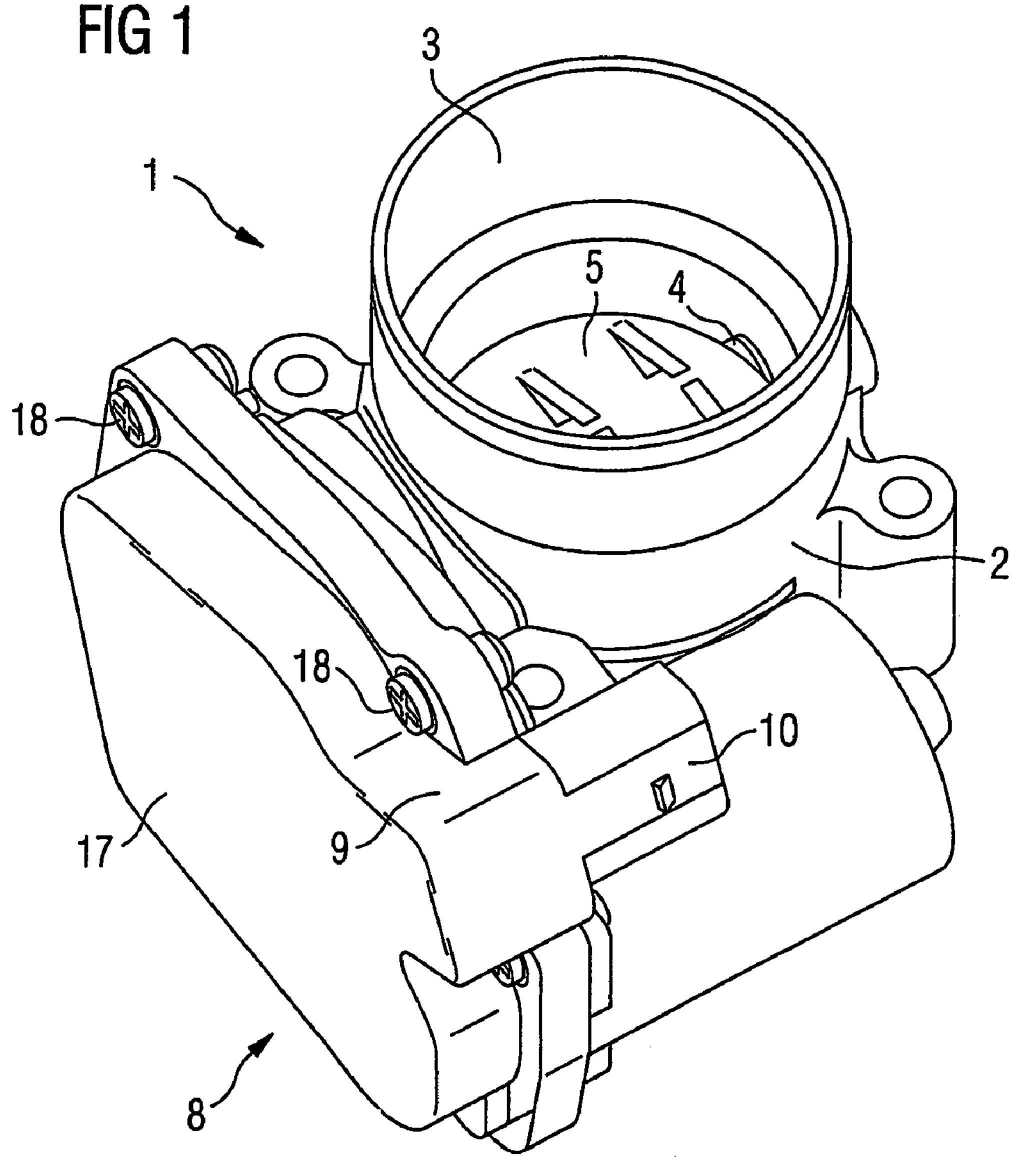
FIG. 1 shows a perspective view of a throttle flap connecting piece
Figure 2:
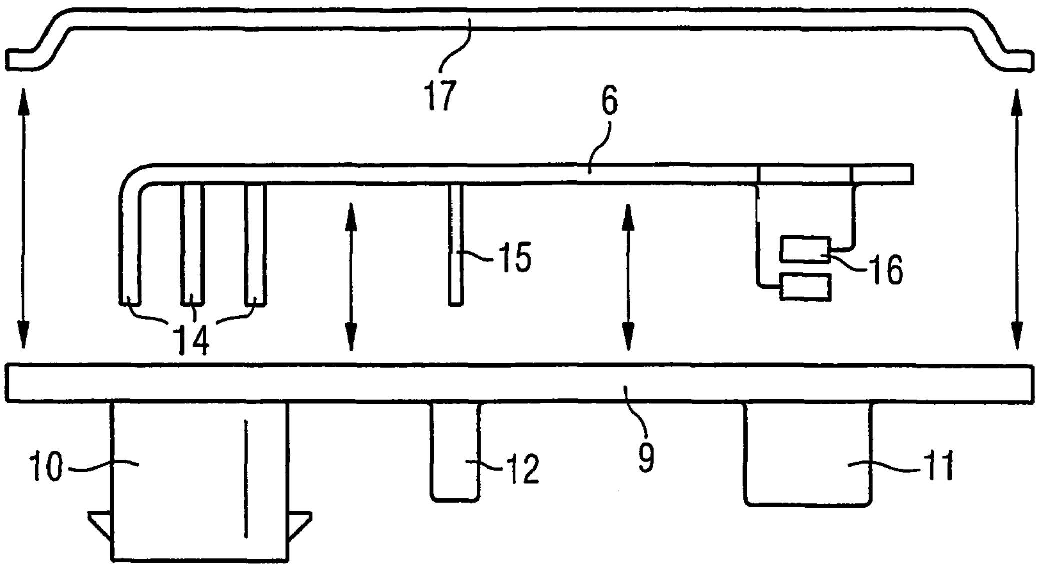
FIG. 2 shows a basic exploded illustration of a housing cover comprising carrier plate, punched grid and covering
Figure 3:
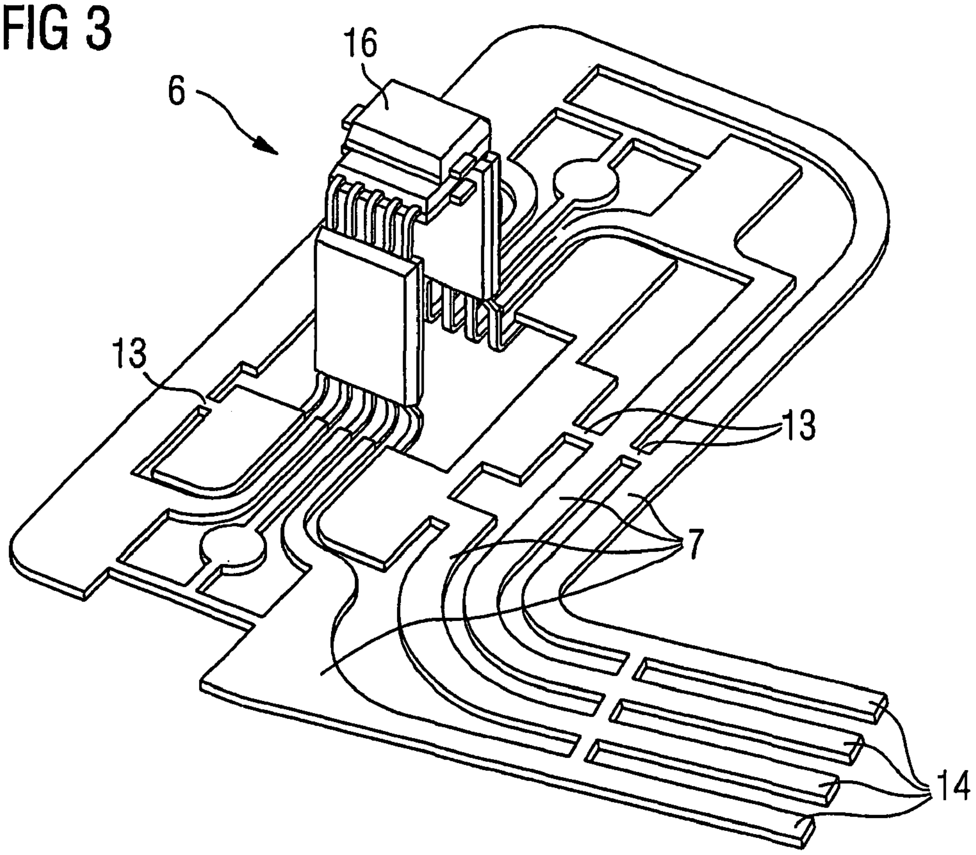
FIG. 3 shows a perspective view of a punched grid.

The throttle flap connecting piece 1 illustrated in the figures has a housing 2 in which a throttle opening 3 is formed. A throttle flap shaft 4 which bears a throttle flap 5, by means of which the passage cross-section of the throttle opening 3 can be shut off, is led transversely through the throttle opening 3.

The two ends of the throttle flap shaft 4 are mounted in bearing holes in the housing 2 such that they can rotate. The one free end of the throttle flap shaft 4 projects through a base into a pot-like housing chamber of the housing 2, of which the outwardly oriented opening can be closed by a housing cover 8.

In a motor chamber which, at its one end, opens into the housing chamber, there is arranged an electric motor, on the motor shaft of which a drive pinion is seated. The drive pinion drives the throttle flap shaft 4 rotatably via a gearbox.

The housing cover 8 has a plate-like carrier 9, which is an insulating plastic injection molding, a sleeve-like plug holder 10 for making contact with a device plug, a pot-like sensor housing 11 and a further plug holder 12 of a motor plug, all of which project into the pot-like housing chamber.

A punched grid 6 is placed on the side of the carrier 9 facing away from the housing chamber and the conductor tracks 7 of the punched grid 6 are held in their position by latching elements, not illustrated. Following this latching fixing of the conductor tracks 7 to the carrier 9, the connecting points 13 of the conductor tracks 7 of the punched grid 6 are divided.

End regions of the conductor tracks 7 are bent down at right angles out of the plane of the punched grid 6 and form contact tongues 14, which project through corresponding leadthroughs in the carrier 9 into the plug holder 10.

A further contact tongue 15 bent down likewise projects through the carrier 9 and projects into the plug holder 12, which forms a motor plug for making contact with the electric motor.

Further conductor tracks 7 are bent down and carry a magnetoresistive sensor 16. This sensor 16 projects through an appropriate opening into the sensor housing 11 and serves as a position sensor for registering the position of the gearbox and therefore of the throttle flap 5.

The conductor tracks 7 of the punched grid 6 are covered completely by a shell-like covering 17 which, at its circumferential edge, is laser welded to the carrier 9 and therefore the space with the conductor tracks 7 is sealed off tightly.

The carrier 9 and therefore the entire housing cover 8 is connected to the housing 2 by means of screws 18 and closes its housing chamber from the outside.

The invention claimed is:

1. A cover for a chamber of a housing of a device, comprising:

an approximately plate-like carrier including a conductor track pattern formed as a punched grid;

a sensor arranged on the conductor track pattern; and a plug holder formed on the carrier for a device plug and arranged for making contact with the conductor track pattern;

wherein the punched grid resting on the approximately plate-like carrier is held by fixing elements and is covered by a covering connected to the carrier at its circumferential edge.

2. The cover according to claim 1, wherein the punched grid comprises contact tongues for making contact with the device plug, the tongues projecting into the plug holder.

3. The cover according to claim 2, wherein the contact tongues are in particular parts of the punched grid bent down out of a plane of the punched grid.

4. The cover according to claim 1, wherein the plug holder is a sleeve protruding from the carrier.

5. The cover according to claim 1, wherein the carrier comprises one or more leadthroughs, through which one or more further contact tongues projecting on the side of the carrier and facing away from the punched grid are led.

6. The cover according to claim 5, wherein the one or more further contact tongues are in particular parts of the punched grid bent down out of a plane of the punched grid.

7. The cover according to claim 1, wherein, on its side facing away from the punched grid, the carrier comprises a sensor housing into which the sensor projects.

8. The cover according to claim 1, wherein the further contact tongues and/or the sensor or the sensor housing project into the chamber of the housings.

9. The cover according to claim 1, wherein the covering is welded, laser welded, or adhesively bonded to the carrier at its circumferential edge.

10. The cover according to claim 1, wherein the covering is detachably connected to the carrier by means of a screw connection so as to be resting with its circumferential edge over a circumferential seal on the carrier.

11. The cover according to claim 1 wherein the fixing elements are latching elements or clamping elements into which the punched grid can be latched or clamped.

12. The cover according to claim 11, wherein the latching elements or clamping elements comprise one piece with the carrier.

13. The cover according to claim 1, wherein the carrier comprises plastic formed into the carrier by a plastic injection molding.

14. The cover according to claim 1, wherein the covering comprises plastic formed as a shell or pot by plastic injection molding.

15. The cover according to claim 1 wherein the punched grid is punched out of a metal sheet or lead frame or from a printed circuit board bearing conductor tracks.

16. The cover according to claim 1, wherein the carrier is connected to the housing by means of screws, so as to be arranged to close the chamber of the housing.

17. The cover according to claim 1, wherein the device is a throttle flap connecting piece for an internal combustion engine, and a continuous throttle opening which can be shut off by a throttle flap arranged on a throttle flap shaft formed in the housing, and an electric-motor drive, by means of which the throttle flap shaft can be driven pivotably also being arranged in the housings.

18. The cover according to claim 17, wherein the sensor is a position sensor arranged to register a position of the gearbox.

19. The cover according to claim 18, wherein the sensor is a magnetoresistive sensor or a Hall sensor.

20. The cover according to claim 17, wherein at least one of the further contact tongues is a motor plug for making contact with the electric-motor drive.

* * * * *